(12) United States Patent
Li

(10) Patent No.: US 11,081,300 B2
(45) Date of Patent: *Aug. 3, 2021

(54) MECHANICAL SWITCH OF PHOTOELECTRICAL TYPE AND A KEY ASSEMBLY OF A KEYBOARD

(71) Applicant: DONGGUAN MINGJIAN ELECTRONIC TECHNOLOGY CO., LTD., Guangdong (CN)

(72) Inventor: Jianping Li, Guangdong (CN)

( * ) Notice: Subject to any disclaimer, the term of this patent is extended or adjusted under 35 U.S.C. 154(b) by 555 days.

This patent is subject to a terminal disclaimer.

(21) Appl. No.: 16/075,995

(22) PCT Filed: Mar. 13, 2017

(86) PCT No.: PCT/CN2017/000231
§ 371 (c)(1),
(2) Date: Aug. 7, 2018

(87) PCT Pub. No.: WO2018/058846
PCT Pub. Date: Apr. 5, 2018

(65) Prior Publication Data
US 2021/0193410 A1  Jun. 24, 2021

(30) Foreign Application Priority Data
Sep. 30, 2016 (CN) .......................... 201610872921.6

(51) Int. Cl.
*H01H 13/705* (2006.01)
*H03K 17/94* (2006.01)

(52) U.S. Cl.
CPC ......... *H01H 13/705* (2013.01); *H03K 17/943* (2013.01); *H01H 2239/022* (2013.01)

(58) Field of Classification Search
CPC ........... H01H 13/703; H01H 2239/022; H03K 17/943
See application file for complete search history.

(56) References Cited

U.S. PATENT DOCUMENTS

| | | | |
|---|---|---|---|
| 6,199,996 B1* | 3/2001 | Katrinecz, Jr. | G06F 3/0202 200/314 |
| 7,283,066 B2* | 10/2007 | Shipman | G06F 3/0202 200/319 |
| 7,294,803 B2* | 11/2007 | Lee | H01H 13/83 200/314 |
| 9,634,661 B1* | 4/2017 | Chen | H03K 17/969 |
| 10,263,618 B2* | 4/2019 | Li | H03K 17/969 |
| 10,544,923 B1* | 1/2020 | Barrowman | G06F 21/88 |
| 10,637,470 B2* | 4/2020 | Wang | G01J 1/0238 |

(Continued)

*Primary Examiner* — Amine Benlagsir
(74) *Attorney, Agent, or Firm* — Prakash Nama; Global IP Services, PLLC

(57) ABSTRACT

A photoelectrical type of mechanical switch, wherein a chute is provided on the bracket; the ram upper end is provided with a protruding strip arranged in the chute which can freely move along the chute; when the bracket moves up and down, the protruding strip is restricted by the chute and drives the ram to rotate by itself. Adoption of the independent sound optical path structure enables its exhibition of more obvious key-pressing stage sense and key-pressing sound when pressing the press shaft, and can realize good "ON/OFF" function of optical path.

9 Claims, 3 Drawing Sheets

(56) References Cited

U.S. PATENT DOCUMENTS

| | | | |
|---|---|---|---|
| 2004/0159779 A1* | 8/2004 | Duff | G06F 3/0219 |
| | | | 250/221 |
| 2010/0078303 A1* | 4/2010 | Larsen | H01H 13/83 |
| | | | 200/5 A |
| 2015/0061901 A1* | 3/2015 | Casparian | H01H 13/705 |
| | | | 341/22 |
| 2015/0061902 A1* | 3/2015 | Casparian | H03K 17/965 |
| | | | 341/22 |
| 2017/0264294 A1* | 9/2017 | Li | H01H 13/70 |
| 2018/0047530 A1* | 2/2018 | Song | H01H 13/20 |

* cited by examiner

MECHANICAL SWITCH OF PHOTOELECTRICAL TYPE AND A KEY ASSEMBLY OF A KEYBOARD

BACKGROUND OF THE INVENTION

This invention is related to the technique field of switch key of the mechanical keyboard.

The key of a keyboard is generally classified into mechanical contact type and photoelectrical switch type, wherein the keyboard key of photoelectrical switch type makes use of photoelectrical coupler technology to replace the mechanical contact structure, which makes use of the optical principle and photoelectrical couple technology, forms into optical path with transmitter and receiver, and optical obstruction element turn off or turn on the optical path, so as to change the circuit impedance to realize the circuit switch. Comparing with other keyboard, the key of photoelectrical switch keyboard has along use life, and a small change in the key hand touch over time.

But because the contact is changed into photoelectrical transition, it causes absence of or difficult to realize the key-pressing hand touch and sound inhered in the contact switch, especially it is it is difficult to produce hand touch and sound at the time of pressing for current keys of the keyboard of photoelectrical switch type, due to having only one press shaft, so it is not obvious for touch sense of the key, and there is no other triggered hint at press. It is necessary to modify the structure of the switch key for this technique shortage, so as to realize the key-pressing hand touch and sound, and be easy to realize cost-efficient industrial manufacture.

BRIEF SUMMARY OF THE INVENTION

For the above problems, the objective of this invention is to provide a mechanical switch of photoelectrical type having an obvious staged key-pressing hand touch and sound at the time of pressing, and on the basis of it to provide a keyboard key assembly easy to be mounted and manufactured.

For this technique purpose, one solution of this invention is a mechanical switch of photoelectrical type, comprising an upper cover, a lower cover, a press shaft and a primary spring, the upper cover and the lower cover matching to form into a hollow holding cavity, in which the press shaft and the primary spring are positioned, the holding cavity is further provided with a sound optical path mechanism abutting against the primary spring, the sound optical path mechanism comprising a secondary spring, a ram, a ram stop guiding groove, and a guiding bracket, the guiding bracket is coupled with the press shaft, moves up and down as the press shaft moving up and down; and a chute is provided on the guiding bracket; the upper end of the ram is provided with a protruding strip, which is arranged in the chute and can freely move along the chute; when the bracket moves up and down, the protruding strip is restricted by the chute and drives the ram to rotate by itself; the secondary spring is mounted on the ram above the protruding strip and stops at the top of the bracket; the ram and the secondary spring are in axial parallel relationship with the primary spring; the lower end of the ram is arranged in the ram stop guiding groove, on which a slot is provided for the protruding strip to slide; the lower end of the ram is provided with a optical path structure.

Preferably, the optical path structure is a transmission hole arranged at the lower end of the ram.

Preferably, the top of the ram stops at the bottom of the secondary spring, and there is no contact between the top of the ram and the top of the bracket.

Preferably, the top of the bracket is provided with a through-hole, and the top of the ram passes through the secondary spring and further through the through-hole.

Preferably, a bulge is provided on the ram at the other side corresponding to the protruding strip, and the guiding groove is respectively provided with a slot for the bulge to slide.

For this technique purpose, another solution of this invention is a key assembly of photoelectrical type mechanical keyboard, comprising mechanical switches of photoelectrical type and a PCB board, wherein the mechanical switch of photoelectrical type comprises an upper cover, a lower cover, a press shaft and a primary spring, the upper cover and the lower cover matching to form into a hollow holding cavity, in which the press shaft and the primary spring are positioned, the holding cavity is further provided with a sound optical path mechanism abutting against the primary spring, the sound optical path mechanism comprising a secondary spring, a ram, a ram stop guiding groove, and a guiding bracket, the guiding bracket is coupled with the press shaft, moves up and down as the press shaft moving up and down; and a chute is provided on the guiding bracket; the upper end of the ram is provided with a protruding strip, which is arranged in the chute and can freely move along the chute; when the bracket moves up and down, the protruding strip is restricted by the chute and drives the ram to rotate by itself; the secondary spring is mounted on the ram above the protruding strip and stops at the top of the bracket; the lower end of the ram is arranged in the ram stop guiding groove, on which a slot is provided for the protruding strip to slide; the lower end of the ram is provided with a optical path structure; there is provided a photoelectrical circuit on the PCB board, which is consisted of a light transmitter IR and a light receiver PT; the mechanical switch of photoelectrical type is mounted on the PCB board, the optical path structure provided on the lower end of the ram forms into a working relationship with the photoelectrical circuit on the respective PCB board corresponding to the switch, and the up and down motion and rotation of the ram can shut off or turn on the photoelectric circuit which is consisted of the light transmitter IR and the light receiver PT.

Preferably, the light transmitter IR and the light receiver PT form into a geminate tubes relationship on the PCB board, the optical path structure is a transmission hole arranged at the lower end of the ram, and the ram is arranged at the middle of the geminate tubes; when the press shaft is depressed, the ram runs down and rotates to enable the through-hole toward the light transmitter IR and the light receiver PT, so as to turn on the photoelectric circuit; when the press shaft is released, the ram runs up and the through-hole rotates to shut off the photoelectric circuit.

Preferably, there is provided a group of protruding hooks on the lower cover, and the PCB is provided with a jack matching with the hook at the respective position, the photoelectrical mechanical switch secured on the PCB board by the hook and jack.

Preferably, the PCB is provided with an anti-collision hole at the position corresponding to the ram, and the ram can protrude into the anti-collision hole when it runs down.

Comparing with the prior art, this invention has below benefits: adoption of the independent sound optical path structure enables its exhibition of more obvious key-pressing stage sense and key-pressing sound when pressing the press shaft, and can realize good "ON/OFF" function of optical path; additionally, the slice manner of the switch with PCB board and the use of patch manufacturing technique to process photoelectrical circuit by PCB board can largely increase processing efficiency and yield, decrease material cost and production cost, acquire robust practicability.

In which: 1 press shaft; 2 upper cover; 3 lower cover; 4 primary spring; 5 secondary spring; 6 ram; 7 ram stop guiding groove; 8 guiding bracket; 9 PCB board; 10 light transmitter IR; 11 light receiver PT; 12 LED lamp bead; 13 optical guide block; 31 hook; 61 protruding strip; 62 bulge; 63 transmission hole; 71 slot; 81 chute; 91 jack; 92 anti-collision hole.

DETAILED DESCRIPTION OF THE INVENTION

This invention will be further described in connection with append figures and embodiments. In the following descriptions, some exemplary embodiments of this invention are only illustratively described. Indubitably, It can be appreciated to those skilled in the art that the described embodiment can be modified in a variety of ways without depart from the spirit and scope of this invention. Hence, appended figures and descriptions are illustrative in nature, and not used for limit the protection scope of claims.

This invention first protects a photoelectrical switch and a keyboard key assembly based on the switch, both of which are the same creative technology on the switch structure.

Figure 1:
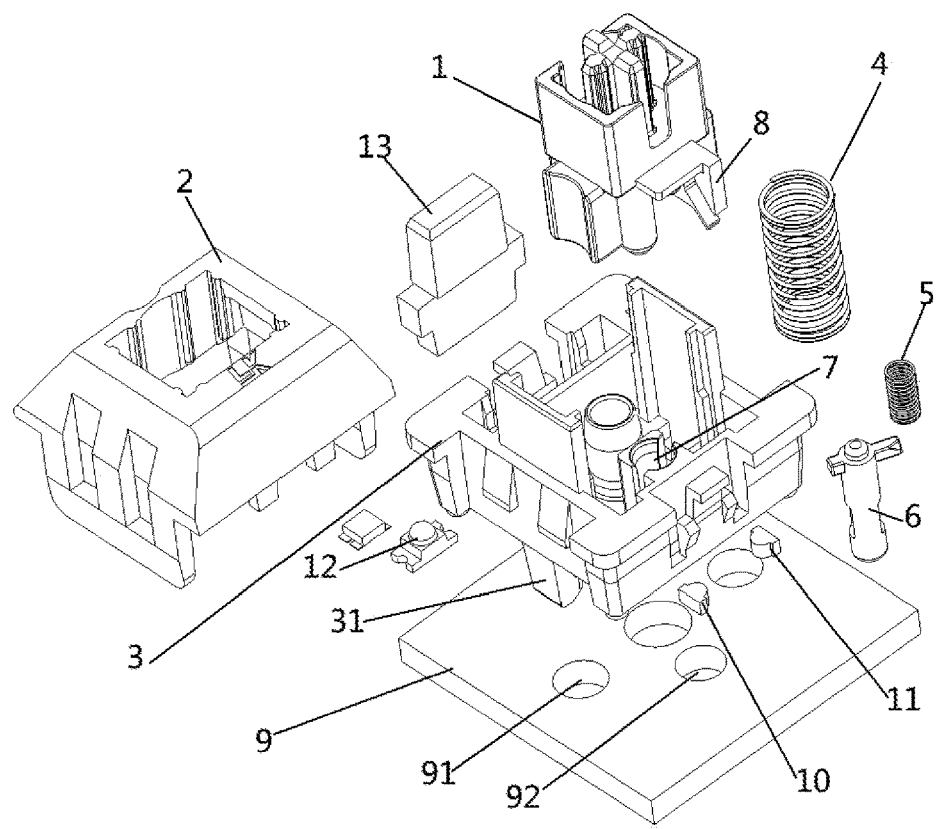
FIG. 1 is an exploded structural view of a special embodiment of a key assembly of the keyboard of this invention.
Figure 2:
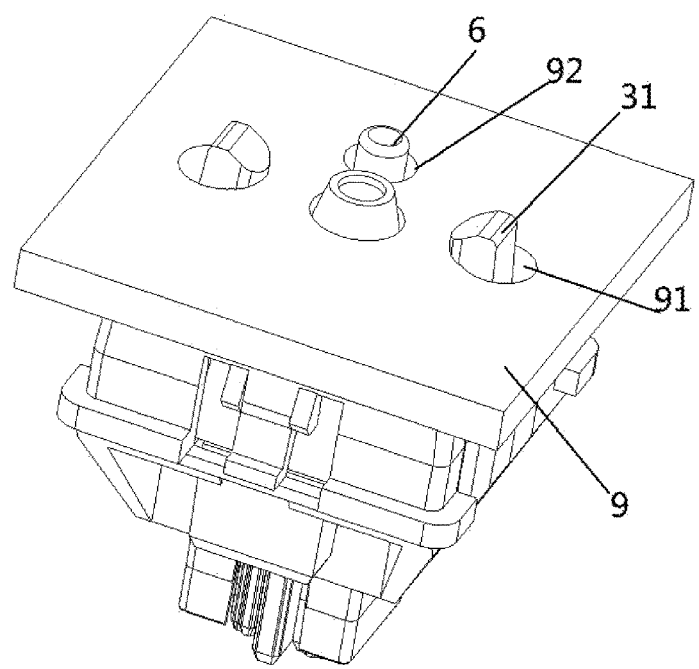
FIG. 2 is a schematic view of a bottom structure of a special embodiment of a key assembly of the keyboard of this invention.
Figure 3:
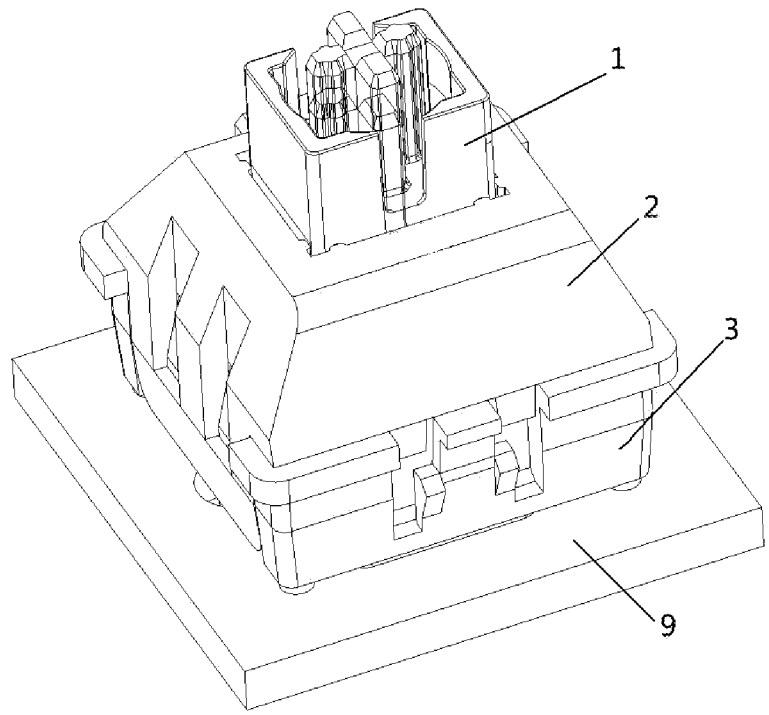
FIG. 3 is a schematic view of a top structure of a special embodiment of a key assembly of the keyboard of this invention.
Figure 4:
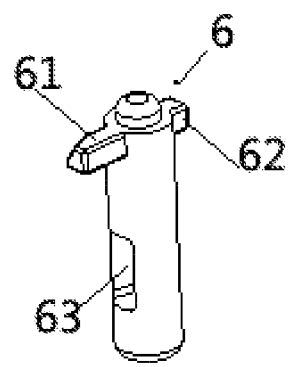
FIG. 4 is a schematic structural view of the ram of this invention.
Figure 5:
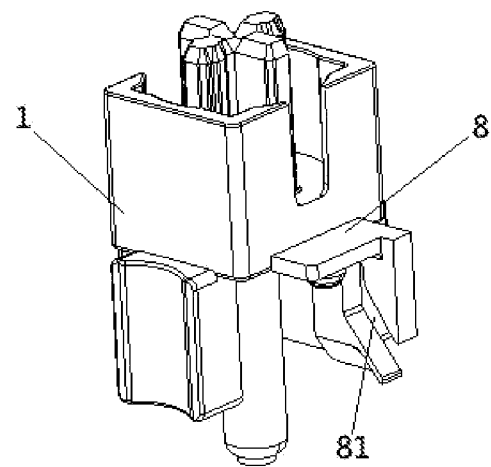
FIG. 5 is a schematic structural view of a press shaft and a guiding bracket of this invention.
Figure 6:
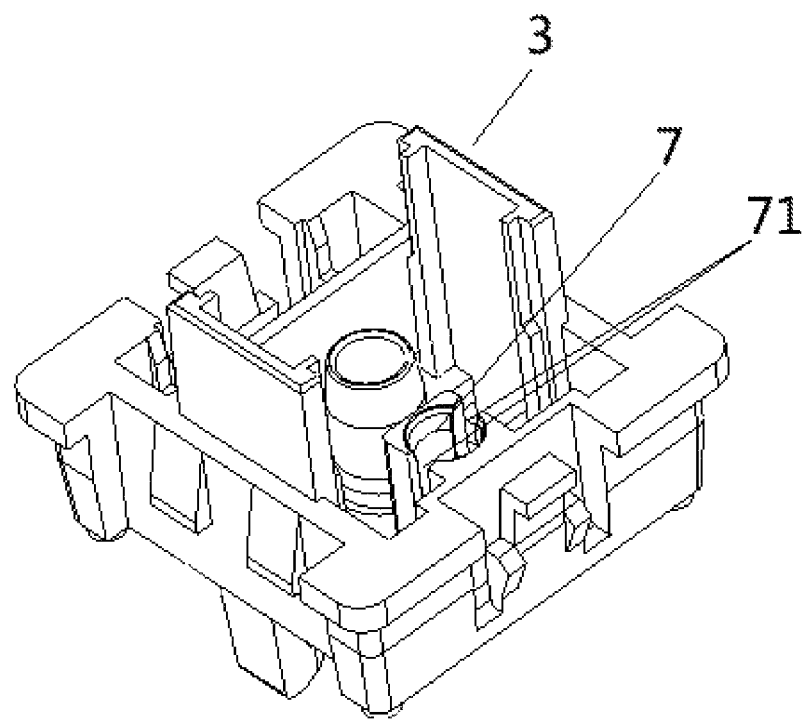
FIG. 6 is a schematic structural view of a lower cover and a stop guiding groove of this invention.

As shown in FIG. 1, in the regard of the main structure, this creative photoelectrical mechanical switch comprises an upper cover 2, a lower cover 3, a press shaft 1 and a primary spring 4, the upper cover and lower cover matching to form into a hollow holding cavity, the press shaft 1 and the primary spring 4 positioned in the holding cavity, the primary spring 4 used for reset of the press shaft 1, all of these belonging to the prior art, and not described in detail. The unique of this creative invention mainly consists in that there is also provided an independent optical path mechanism in the holding cavity abutting against the primary spring, which mechanism not only realizes "ON/OFF" function of the optical path, but also produces sound of key-pressing and stage sense, and is beneficial to increase user experience. As shown in FIGS. 4, 5, and 6, the sound optical path mechanism of this invention comprises a secondary spring 5, a ram 6, a ram stop guiding groove 7 and a guiding bracket 8, wherein:

the guiding bracket 8 is coupled with the press shaft 1, so as to move up and down with the press shaft 1; as shown in FIG. 5, a chute 81 is provided on the guiding bracket 8, the role of which is to transit the up and down motion into rotation of the ram 6, which will be described in detail hereafter;

the upper end of the ram 6 is provided with a protruding strip 61, which is arranged in the chute 81 and can freely move along the chute; when the guiding bracket 8 moves up and down, the protruding strip 61 is restricted by the chute 81 and drives the ram 6 to rotate around its own axis;

the secondary spring 5 is mounted on the ram 6 above the protruding strip, and stops at the top of the guiding bracket 8; the ram 6 and the secondary spring 5 are in axial parallel relationship with the primary spring 4; the lower end of the ram 6 is arranged in the ram stop guiding groove 7, on which there is provided a slot 71 for the protruding strip 61 to slide; the role of the second spring is to produce downward pressure for enabling the protruding strip to suddenly exhale sound when sliding into the slot 71. In the best embodiment, the top of the ram 6 stops at the bottom of the secondary spring 5, and there is no contact between the top of ram 6 and the top of bracket; certainly, it is also feasible to adopt a solution in the embodiments that the top of the guiding bracket is provided with a through-hole.

The lower end of the ram 6 is provided with an optical path structure, which is a transmission hole arranged at the lower end of the ram in the best embodiment. Of course, in order to realize "ON/OFF" function of the optical path, the path structure can be designed as a reflective mirror or otherwise if required.

In order for stability of the ram movement, there is provided a small bulge 62 on the ram 6 at the other side corresponding to the protruding strip 61, and the ram stop guiding groove 7 is respectively provided with a slot for the small bugle 62 to slide, as shown in FIG. 6.

Another solution of this invention is a key assembly of a keyboard based on the above photoelectrical mechanical switch, the assembly comprises photoelectrical mechanical switches and a PCB board 9, on which a photoelectrical circuit consisted of a light transmitter IR 10 and a light receiver PT 11 is provided, and in the specific embodiments, the elements described above are arranged on the PCB board with patch manufacturing technique, so as to make it easy to be processed, and decrease manufacturing cost.

The mechanical switch of photoelectrical type is mounted on the PCB board 9 after independent fabrication, the optical path structure provided on the lower end of the ram 6 forms into a working relationship with the photoelectrical circuit on the respective PCB board 9 corresponding to the switch, and the up and down movement and rotation of the ram can shut off or turn on the photoelectric circuit which is consisted of the light transmitter IR and the light receiver PT, and produce key signal. In the preferred embodiments, the light transmitter IR and the light receiver PT form into a geminate tubes relationship on the PCB board, the optical path structure is a transmission hole 63 arranged at the lower end of the ram, and the ram is arranged at the middle of the geminate tubes; when the press shaft is depressed, the ram runs down and rotates to enable the through-hole toward the light transmitter IR and the light receiver PT, so as to turn on the photoelectric circuit; when the press shaft is released, the ram runs up and the through-hole rotates to shut off the photoelectric circuit.

In order to ensure the mounting stability and convenience, a group of hooks 31 are provided on the lower cover 2, the PCB is provided with a jack 91 matching with the hook at respective position, and the mechanical switch of photoelectrical type is pluggably secured on the PCB board through the hook and jack.

In order to prevent collision of the ram 6 with the PCB board and ensure safety of the PCB, there is provided an anti-collision hole 92 at the respective position corresponding to the ram 6, so that the bottom of the ram 6 can protrude into the anti-collision hole 92 at running down.

The basic principle, main features and benefits of this invention are shown and described in the above text. It should be understood to those technique skills in the art that the invention is not limited to the above embodiments, and those described in the above embodiments and descriptions only illustrate the principle of this invention, so that the invention also has a variety of changes and modifications without depart from the spirit and scope of this invention, such changes and modifications falling into the claimed protection scope of the invention. The claimed protection scope of the invention is defined by appended claims and equals.

What is claimed is:

1. A mechanical switch of photoelectrical type comprising:
    an upper cover, a lower cover, a press shaft and a primary spring, the upper cover and the lower cover matching to form into a hollow holding cavity, in which the press shaft and the primary spring are positioned, is characterized in that, the holding cavity is further provided with a sound optical path mechanism abutting against the primary spring,
    the sound optical path mechanism comprising a secondary spring, a ram, a ram stop guiding groove, and a guiding bracket, wherein, the guiding bracket is coupled with the press shaft, moves up and down as the press shaft moving up and down; and
    a chute is provided on the guiding bracket; an upper end of the ram is provided with a protruding strip, which is arranged in the chute and can freely move along the chute; when the guiding bracket moves up and down, the protruding strip is restricted by the chute and drives the ram to rotate by itself; the secondary spring is mounted on the ram above the protruding strip and stops at a top of the guiding bracket; the ram and the second spring are in a parallel relationship with the primary spring; a lower end of the ram is arranged in the ram stop guiding groove, on which a slot is provided for the protruding strip to slide; the lower end of the ram is provided with an optical path structure.

2. The mechanical switch of the photoelectrical type according to claim 1, characterized in that the optical path structure is a transmission hole arranged at the lower end of the ram.

3. The mechanical switch of the photoelectrical type according to claim 1, characterized in that a top of the ram stops at a bottom of the secondary spring, and there is no contact between the top of the ram and the top of the guiding bracket.

4. The mechanical switch of the photoelectrical type according to claim 1, characterized in that the top of the guiding bracket is provided with a through-hole, and a top of the ram passes through the secondary spring and further through the through-hole.

5. The mechanical switch of the photoelectrical type according to claim 1, characterized in that a bulge is provided on the ram at an other side corresponding to the protruding strip, and the ram stop guiding groove is respectively provided with a secondary slot for the bulge to slide.

6. A mechanical keyboard key assembly of photoelectrical type, comprising:
    mechanical switches of the photoelectrical type and a printed circuit board (PCB), characterized in that: each mechanical switch of the mechanical switches of the photoelectrical type comprises: an upper cover, a lower cover, a press shaft and a primary spring, the upper cover and the lower cover matching to form into a hollow holding cavity, in which the press shaft and the primary spring are positioned, the holding cavity is further provided with a sound optical path mechanism abutting against the primary spring, the sound optical path mechanism comprising a secondary spring, a ram, a ram stop guiding groove, and a guiding bracket, the guiding bracket is coupled with the press shaft, moves up and down as the press shaft moving up and down; and a chute is provided on the guiding bracket; an upper end of the ram is provided with a protruding strip, which is arranged in the chute and can freely move along the chute; when the guiding bracket moves up and down, the protruding strip is restricted by the chute and drives the ram to rotate by itself; the secondary spring is mounted on the ram above the protruding strip and stops at a top of the guiding bracket; a lower end of the ram is arranged in the ram stop guiding groove, on which a slot is provided for the protruding strip to slide; the lower end of the ram is provided with an optical path structure; there is provided a photoelectrical circuit on the PCB, which is consisted of a light transmitter infrared (IR) and a light receiver phototransistor (PT);
    said each mechanical switch of the mechanical switches of the photoelectrical type is mounted on the PCB, the optical path structure provided on the lower end of the ram forms into a working relationship with the photoelectrical circuit on the PCB corresponding to said each mechanical switch of the mechanical switches of the photoelectrical type, and an up and down motion and rotation of the ram can shut or turn on the photoelectrical circuit which is consisted of the light transmitter IR and the light receiver PT.

7. The mechanical keyboard key assembly of the photoelectrical type according to claim 6, characterized in that, the light transmitter IR and the light receiver PT are related as geminate tubes on the PCB, the optical path structure is a transmission hole arranged at the lower end of the ram, and the ram is arranged at a middle of the geminate tubes; when the press shaft is depressed, the ram runs down and rotates to enable a through-hole toward the light transmitter IR and the light receiver PT, so as to turn on the photoelectrical circuit; when the press shaft is released, the ram runs up and the through-hole rotates to shut off the photoelectrical circuit.

8. The mechanical keyboard key assembly of the photoelectrical type according to claim 6, characterized in that, there is provided a group of protruding hooks on the lower cover, and the PCB is provided with jacks matching with the group of protruding hooks respectively at respective positions, said each mechanical switch of the mechanical switches of the photoelectrical type secured on the PCB by the group of protruding hooks and the jacks.

9. The mechanical keyboard key assembly of the photoelectrical type according to claim 6, characterized in that, the PCB is provided with an anti-collision hole at a position corresponding to the ram, and the ram can protrude into the anti-collision hole when it runs down.

\* \* \* \* \*